(12) United States Patent
Park et al.

(10) Patent No.: US 8,951,853 B1
(45) Date of Patent: Feb. 10, 2015

(54) METHOD OF FORMING SEMICONDUCTOR DEVICE USING SI-H RICH SILICON NITRIDE LAYER

(75) Inventors: Pan-Kwi Park, Suwon-si (KR);
Dong-Suk Shin, Yongin-si (KR);
Yong-Kuk Jeong, Suwon-si (KR);
Dong-Hyun Roh, Suwon-si (KR);
Ha-Jin Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 801 days.

(21) Appl. No.: 12/659,474

(22) Filed: Mar. 10, 2010

(51) Int. Cl.
*H01L 21/8238* (2006.01)

(52) U.S. Cl.
USPC .................................................. 438/199

(58) Field of Classification Search
USPC .......................................... 438/791; 257/640
See application file for complete search history.

(56) References Cited

U.S. PATENT DOCUMENTS

| | | | | |
|---|---|---|---|---|
| 5,587,344 | A * | 12/1996 | Ishikawa ........................ | 438/786 |
| 6,451,704 | B1 * | 9/2002 | Pradeep et al. ................ | 438/719 |
| 2004/0061179 | A1 * | 4/2004 | Carroll et al. .................. | 257/368 |
| 2004/0104405 | A1 * | 6/2004 | Huang et al. ................... | 257/199 |
| 2004/0209432 | A1 * | 10/2004 | Ku et al. ......................... | 438/301 |
| 2006/0244074 | A1 * | 11/2006 | Chen et al. ...................... | 257/371 |
| 2006/0269692 | A1 | 11/2006 | Balseanu et al. | |
| 2007/0278541 | A1 * | 12/2007 | Huang et al. ................... | 257/288 |
| 2009/0075442 | A1 | 3/2009 | Ke et al. | |

FOREIGN PATENT DOCUMENTS

| | | |
|---|---|---|
| JP | 2008-053587 A | 3/2008 |
| KR | 10-2008-0002886 A | 1/2008 |

OTHER PUBLICATIONS

Auer, et al., Accurate determination of the hydrogen concentration of Silicon Nitride Layers, SPIE Conference on Microelectronic manufacturing Yield, Sep. 1998, pp. 203-210.

* cited by examiner

*Primary Examiner* — Seahvosh Nikmanesh
(74) *Attorney, Agent, or Firm* — Lee & Morse, P.C.

(57) ABSTRACT

A method of forming a semiconductor device includes forming a gate electrode and source/drain regions in a semiconductor substrate, forming a first capping nitride layer covering the gate electrode and the source/drain regions, the first capping nitride layer including a Si—H rich SiN layer, annealing the semiconductor substrate having the first capping nitride layer, and removing the first capping nitride layer.

18 Claims, 9 Drawing Sheets

METHOD OF FORMING SEMICONDUCTOR DEVICE USING SI-H RICH SILICON NITRIDE LAYER

BACKGROUND

1. Field

Embodiments relate to a method forming a semiconductor device using a Si—H rich silicon nitride layer as a tensile stress capping layer.

2. Description of Related Art

Numerous semiconductor devices employ a technique of forming NMOS transistors and PMOS transistors on a substrate. Here, improved performance of the NMOS transistors is a very important factor in light of heightened integration density. In order to improve characteristics of the semiconductor device, research into various methods is underway.

SUMMARY

Embodiments are directed to a method of forming a semiconductor device using a Si—H rich silicon nitride layer, which substantially overcomes one or more problems due to the limitations and disadvantages of the related art.

It is therefore a feature of an embodiment to provide a method of forming a semiconductor device capable of enhancing performance of an NMOS transistor.

At least one of the above and other features and advantages may be realized by providing a method of forming a semiconductor device including forming a gate electrode and source/drain regions in a semiconductor substrate, forming a first capping nitride layer covering the gate electrode and the source/drain regions, the first capping nitride layer including a Si—H rich SiN layer, annealing the semiconductor substrate having the first capping nitride layer, and removing the first capping nitride layer.

A ratio of Si—H % and N—H % in the first capping nitride layer may be about 2 to about 10.

A ratio of Si—H % and N—H % in the first capping nitride layer may be about 5 or higher.

The first capping nitride layer may have a tensile stress of about 0.01 GPa to about 2.5 GPa.

The method may further include forming a sacrificial oxide layer covering the gate electrode and the source/drain regions before forming the first capping nitride layer.

The method may further include forming a second capping nitride layer having an N—H rich SiN layer on the semiconductor substrate before forming the first capping nitride layer.

A ratio of Si—H % and N—H % in the second capping nitride layer may be about 1 or lower.

Annealing the semiconductor substrate may include processing the semiconductor substrate having the first capping nitride layer at a temperature of about 1100° C. to about 1300° C.

The annealing may be performed using at least one of a laser spike annealing technique and a flash lamp annealing technique.

Annealing the semiconductor substrate may include performing a first annealing process on the semiconductor substrate having the first capping nitride layer at a temperature of about 1000° C. to about 1100° C., and, after performing the first annealing process, performing a second annealing process at a temperature higher than the first annealing process.

The first annealing process may be performed using a rapid thermal processing device, and the second annealing process is performed at a temperature of about 1100° C. to about 1300° C. using at least one of a laser spike annealing technique and a flash lamp annealing technique.

The method may further include forming a gate dielectric layer having a first thickness between the gate electrode and the semiconductor substrate before forming the first capping nitride layer. The gate dielectric layer may have a second thickness that is increased by about 0.5 Å to about 2 Å more than the first thickness after annealing the semiconductor substrate.

At least one of the above and other features and advantages may also be realized by providing a method of forming a semiconductor device including forming an NMOS transistor and a PMOS transistor in a semiconductor substrate, forming a first capping nitride layer covering the NMOS transistor, the first capping nitride layer including a Si—H rich SiN layer, annealing the semiconductor substrate having the first capping nitride layer, and removing the first capping nitride layer Forming the NMOS transistor may include forming an isolation layer defining a p-active region in the semiconductor substrate, forming a gate dielectric layer and a gate electrode on the p-active region, and forming source/drain regions in the p-active region adjacent to both sides of the gate electrode.

The thickness of the gate dielectric layer may be increased by about 0.5 Å to about 2.0 Å after annealing the semiconductor substrate.

A ratio of Si—H % and N—H % in the first capping nitride layer may be about 5 to about 10.

The first capping nitride layer may have a tensile stress of about 0.01 GPa to about 2.5 GPa.

The method may further include forming a sacrificial oxide layer covering the NMOS transistor before forming the first capping nitride layer.

The method may further include forming a second capping nitride layer having an N—H rich SiN layer on the semiconductor substrate before forming the first capping nitride layer, wherein a ratio of Si—H % and N—H % in the second capping nitride layer is about 1 or lower.

Annealing the semiconductor substrate may include performing a first annealing process on the semiconductor substrate having the first capping nitride layer at a temperature of 1000° C. to 1100° C. using a rapid thermal processing device, and, after performing the first annealing process, performing a second annealing process on the semiconductor substrate at a temperature of 1100° C. to 1300° C. using at least one of a laser spike annealing technique and a flash lamp annealing technique.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
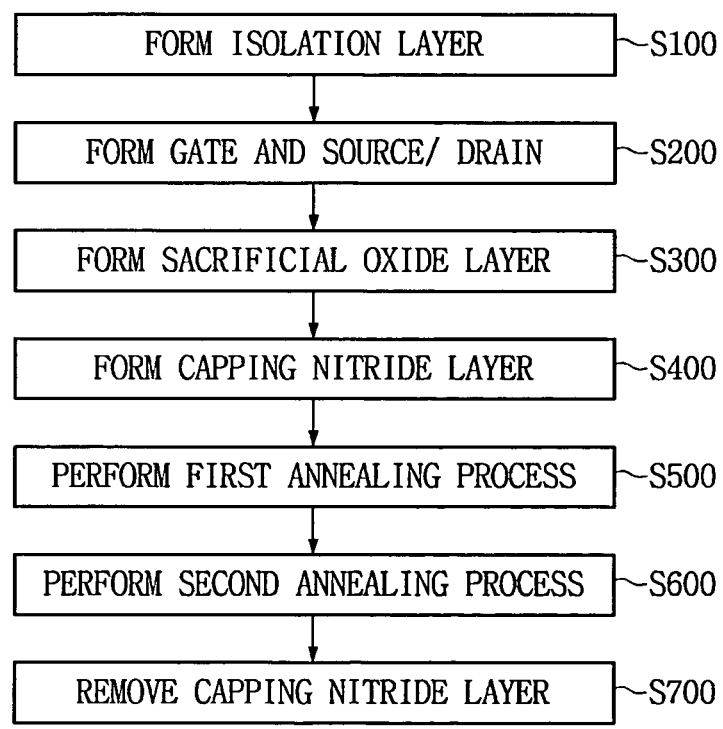
FIG. 1 illustrates a process flowchart of a method of forming a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a process flowchart of a method of forming a semiconductor device according to example embodiments.

Referring to FIG. 1, a method of forming a semiconductor device according to example embodiments may include forming an isolation layer (S100), forming a gate and a source/drain (S200), forming a sacrificial oxide layer (S300), forming a capping nitride layer (S400), performing a first annealing process (S500), performing a second annealing process (S600), and removing the capping nitride layer (S700). The capping nitride layer may include a Si—H rich silicon nitride (SiN) layer, i.e., a silicon nitride layer having Si—H bonds and Si—N bonds and being rich in the Si—H bonds relative to the Si—N bonds. The second annealing process may be performed at a temperature higher than the first annealing process. The second annealing process may be performed using a different technique from the first annealing process.

First Example Embodiment

FIGS. 2 to 6 illustrate cross-sectional views of stages in a method of forming a semiconductor device according to a first example embodiment.

Figure 2:
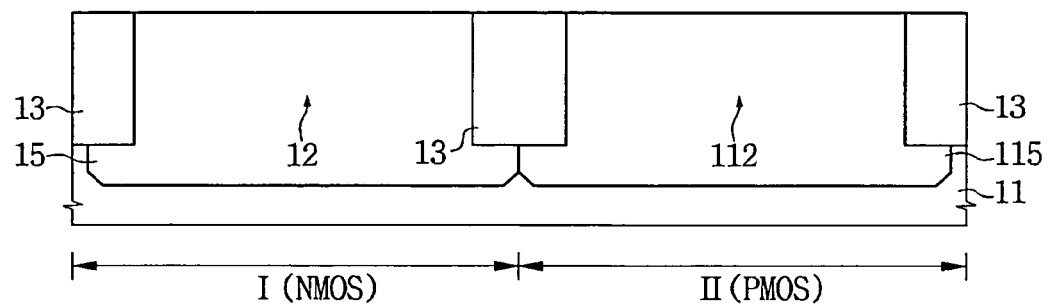
FIGS. 2 to 6 illustrate cross-sectional views of stages in a method of forming a semiconductor device according to a first example embodiment.

Referring to FIGS. 1 and 2, an isolation layer 13 defining active regions 12 and 112 may be formed in a semiconductor substrate 11 (S100). Also, a p-well 15 and an n-well 115 may be formed in the semiconductor substrate 11.

The semiconductor substrate 11 may be, e.g., a bulk silicon wafer or a silicon-on-insulator (SOI) wafer. The semiconductor substrate 11 may include a first region I and a second region II. The first region I may be an NMOS region and the second region II may be a PMOS region. The active regions 12 and 112 may be respectively classified as a p-active region 12 and an n-active region 112. The p-active region 12 may be defined in the p-well 15 by the isolation layer 13, and the n-active region 112 may be defined in the n-well 115 by the isolation layer 13. The p-well 15 may be formed by, e.g., implanting p-type impurity ions into the first region I of the semiconductor substrate 11. The n-well 115 may be formed by, e.g., implanting n-type impurity ions into the second region II of the semiconductor substrate 11. The p-well 15 and the n-well 115 may be formed before forming the isolation layer 13. Alternatively, the p-well 15 and the n-well 115 may be formed after forming the isolation layer 13.

The isolation layer 13 may be formed using, e.g., a shallow trench isolation (STI) technique. The isolation layer 13 may be formed of, e.g., a silicon oxide layer, a silicon nitride layer, a silicon oxynitride layer, or a combination thereof. The isolation layer 13 may be formed on a higher level than bottoms of the p-well 15 and the n-well 115. Top surfaces of the isolation layer 13 and the active regions 12 and 112 may be exposed.

Figure 3:
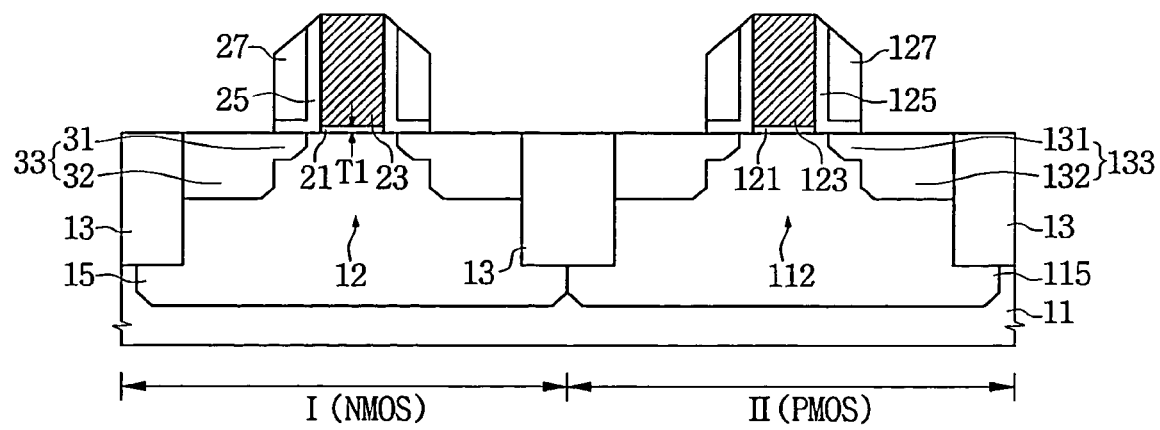

Referring to FIGS. 1 and 3, respective gate electrodes 23 and 123 and source/drain regions 33 and 133 may be formed in the semiconductor substrate 11 having the isolation layer 13 (S200). For example, a first gate dielectric layer 21 and a first gate electrode 23 may be formed on the p-active region 12. A second gate dielectric layer 121 and a second gate electrode 123 may be formed on the n-active region 112. The first gate dielectric layer 21 may be formed of, e.g., a silicon oxide layer, a silicon nitride layer, a silicon oxynitride layer, a high-k dielectric layer, or a combination thereof. The first gate dielectric layer 21 may be formed to a first thickness T1 between the first gate electrode 23 and the p-active region 12. The first gate electrode 23 may be formed of, e.g., a polysilicon layer. The second gate dielectric layer 121 may be formed of, e.g., a silicon oxide layer, a silicon nitride layer, a silicon oxynitride layer, a high-k dielectric layer, or a combination thereof. In an implementation, the first and second gate dielectric layers 121, 122, may be formed at the same stage, of a same material, and to a same initial thickness, e.g., T1. The second gate electrode 123 may be formed of, e.g., a polysilicon layer. The first gate dielectric layer 21, the first gate electrode 23, the second gate dielectric layer 121, and the second gate electrode 123 may be formed using a plurality of thin film forming processes, photo processes, and etching processes.

A first offset spacer 25 covering sidewalls of the first gate electrode 23 may be formed. The first offset spacer 25 may be formed of, e.g., a silicon oxide layer, a silicon nitride layer, a silicon oxynitride layer, or a combination thereof. For example, the first offset spacer 25 may be formed of a silicon oxide layer. A first lightly doped drain (LDD) 31 may be formed by, e.g., implanting n-type impurity ions into the p-active region 12 adjacent to both sides of the first gate electrode 23. In this case, the first LDD 31 may be self-aligned to the outside of the first gate electrode 23 and the first offset spacer 25. In some example embodiments, the first LDD 31 may be formed before forming the first offset spacer 25. In this case, the first LDD 31 may be self-aligned to a sidewall of the first gate electrode 23. In other example embodiments, the first offset spacer 25 may be omitted.

A first sidewall spacer 27 may be formed on the outside of the first offset spacer 25. The first sidewall spacer 27 may be formed of, e.g., a silicon oxide layer, a silicon nitride layer, a silicon oxynitride layer, or a combination thereof. For example, the first sidewall spacer 27 may be formed of a silicon nitride layer. The first sidewall spacer 27 may partially cover an upper part of the first LDD 31. First high-concentration impurity regions 32 may be formed by, e.g., implanting n-type impurity ions into the p-active region 12 using the first gate electrode 23, the first offset spacer 25, and the first sidewall spacer 27 as ion implantation masks. In this case, the first high-concentration impurity regions 32 may be self-aligned to the outside of the first sidewall spacer 27. The first LDD 31 may be kept below the first sidewall spacer 27. The first LDD 31 and the first high-concentration impurity regions 32 may constitute first source/drain regions 33.

A second offset spacer 125 covering sidewalls of the second electrode 123 may be formed. The second offset spacer 125 may be formed of, e.g., a silicon oxide layer, a silicon nitride layer, a silicon oxynitride layer, or a combination thereof. A second LDD 131 may be formed by, e.g., implanting p-type impurity ions into the n-active region 112 adjacent to both sides of the second gate electrode 123. In this case, the second LDD 131 may be self-aligned to the outside of the second gate electrode 123 and the second offset spacer 125. In some example embodiments, the second LDD 131 may be formed before forming the second offset spacer 125. In this case, the second LDD 131 may be self-aligned to a sidewall of the second gate electrode 123. In other example embodiments, the second offset spacer 125 may be omitted.

A second sidewall spacer 127 may be formed on the outside of the second offset spacer 125. The second sidewall spacer 127 may be formed of, e.g., a silicon oxide layer, a silicon nitride layer, a silicon oxynitride layer, or a combination thereof. The second gate electrode 123, the second offset spacer 125 and the second sidewall spacer 127 may be used as ion implantation masks to implant p-type impurity ions into the n-active region 112, so that second high-concentration impurity regions 132 may be formed. In this case, the second high-concentration impurity regions 132 may be self-aligned to the outside of the second sidewall spacer 127. The second LDD 131 may be kept below the second sidewall spacer 127. The second LDD 131 and the second high-concentration impurity regions 132 may constitute second source/drain regions 133.

The process of forming the gate electrodes 23 and 123, the first offset spacer 25, the first sidewall spacer 27, the second offset spacer 125, the second sidewall spacer 127, and the source/drain regions 33 and 133 may include a plurality of thin film forming processes, a plurality of mask pattern forming processes, a plurality of etching processes, and a plurality of ion implantation processes. Such operations are well known and, thus, further details thereof will be omitted for clarity. The first gate electrode 23, the first gate dielectric layer 21, the first source/drain regions 33, and the p-active region 12 may constitute an NMOS transistor. The second gate electrode 123, the second gate dielectric layer 121, the second source/drain 133, and the n-active region 12 may constitute a PMOS transistor. A plurality of NMOS transistors may be formed in the first region I, and a plurality of PMOS transistors may be formed in the second region II.

Figure 4:
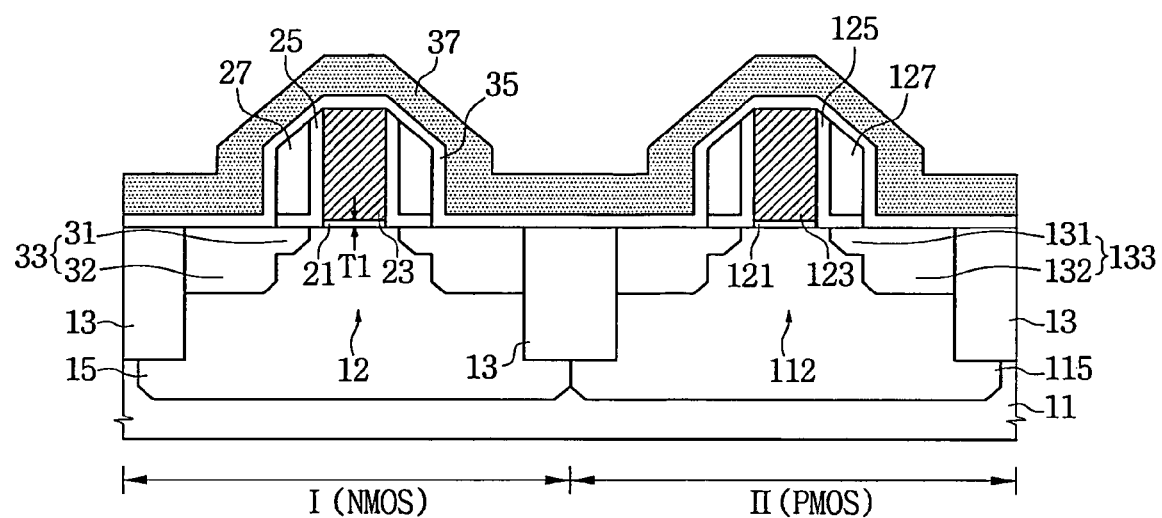

Referring to FIGS. 1 and 4, a sacrificial oxide layer 35 may be formed on the semiconductor substrate 11, and a capping nitride layer 37 may be formed on the sacrificial oxide layer 35 (S400). For example, the sacrificial oxide layer 35 covering the entire surface of the semiconductor substrate 11 may be formed. Thus, the sacrificial oxide layer 35 may cover surfaces of the gate electrodes 23 and 123, the first offset spacer 25, the first sidewall spacer 27, the second offset spacer 125, the second sidewall spacer 127, the source/drain regions 33 and 133, and the isolation layer 13 with a uniform thickness. The sacrificial oxide layer 35 may be formed of, e.g., a silicon oxide layer such as a low temperature oxide (LTO) having a thickness of about 3 nm to about 20 nm. In some example embodiments, the sacrificial oxide layer 35 may be omitted.

The capping nitride layer 37 may cover a top surface of the sacrificial oxide layer 35 with a uniform thickness. A uniform thickness may be achieved using a conformal deposition process, e.g., chemical vapor deposition (CVD), etc. The capping nitride layer 37 may be formed of a Si—H rich SiN layer. The capping nitride layer 37 may be formed such that a ratio of Si—H % to N—H % is about 2 to about 10 when it is measured using Fourier-Transform Infrared (FTIR) spectroscopy. For example, when measured using FTIR spectroscopy, the capping nitride layer 37 may be formed such that the ratio of Si—H % to N—H % is about 5 or higher. In an implementation, the capping nitride layer 37 may have a ratio of (Si—H %)/(N—H %) of 5 to 10. The determination of Si—H % and N—H % may be made by evaluating the intensities of the Si—H and N—H absorption lines in the FTIR spectrum. A transmission spectrum of a pure Si wafer (having a same thickness as the substrate of the coated wafer) may be subtracted from the transmission spectrum of the silicon nitride-coated wafer. From the resulting transmission spectrum, the absorbance may be calculated by absorbance=−log(transmission). In order to quantitatively determine the hydrogen concentration in the SiN layer by FTIR, calibration factors obtained by other techniques may be used in order to convert between the intensity of the absorption lines and the hydrogen concentration. Calibration may be performed by a resonant nuclear reaction using a nitrogen isotope ($^{15}$N) so as to provide a concentration profile of hydrogen versus depth and a total hydrogen concentration, which may then be apportioned between Si—H and N—H bonding. A detailed discussion of such a determination is set forth in "Accurate determination of the hydrogen concentration of Silicon Nitride layers by Fourier transform spectroscopy" by Jonak-Auer and Kuchar (SPIE Conference on Microelectronic Manufacturing Yield, Reliability, and Failure Analysis IV; Santa Clara, Calif.; September 1998; SPIE Vol. 3510), which is hereby incorporated by reference in its entirety.

The capping nitride layer 37 may be formed at a temperature of about 350° C. to about 500° C. using, e.g., low pressure chemical vapor deposition (LPCVD), plasma enhanced chemical vapor deposition (PECVD), high density plasma chemical vapor deposition (HDPCVD), or a combination thereof. The capping nitride layer 37 may be formed to a thickness of about 10 nm to about 100 nm. For example, the capping nitride layer 37 may be formed to a thickness of 50 nm. The capping nitride layer 37 may be formed to have a tensile stress of 0.01 GPa to 2.5 GPa. Thus, the capping nitride layer 37 may be a strongly tensile SiN layer.

In the case that the sacrificial oxide layer 35 is omitted, the capping nitride layer 37 may be in contact with surfaces of the gate electrodes 23 and 123, the first offset spacer 25, the first sidewall spacer 27, the second offset spacer 125, the second sidewall spacer 127, the source/drain regions 33 and 133, and the isolation layer 13.

In some example embodiments, before forming the capping nitride layer 37, a plasma or UV treatment, e.g., including one or more of $N_2$, $H_2$, He, Ar, $O_2$, $O_3$, $N_2O$, or NO, may be performed on the semiconductor substrate 11 including the sacrificial oxide layer 35. In other example embodiments, after forming the capping nitride layer 37, a plasma or UV treatment, e.g., including one or more of $N_2$, $H_2$, He, Ar, $O_2$, $O_3$, $N_2O$, or NO, may be performed on the semiconductor substrate 11 including the capping nitride layer 37. In still other example embodiments, before and after forming the capping nitride layer 37, a plasma or UV treatment, e.g., including one or more of $N_2$, $H_2$, He, Ar, $O_2$, $O_3$, $N_2O$, or NO, may be performed on the semiconductor substrate 11. The plasma and/or UV treatment may be performed at, e.g., a temperature of about 300° C. to about 700° C. for about 1 min to about 10 min.

Figure 5:
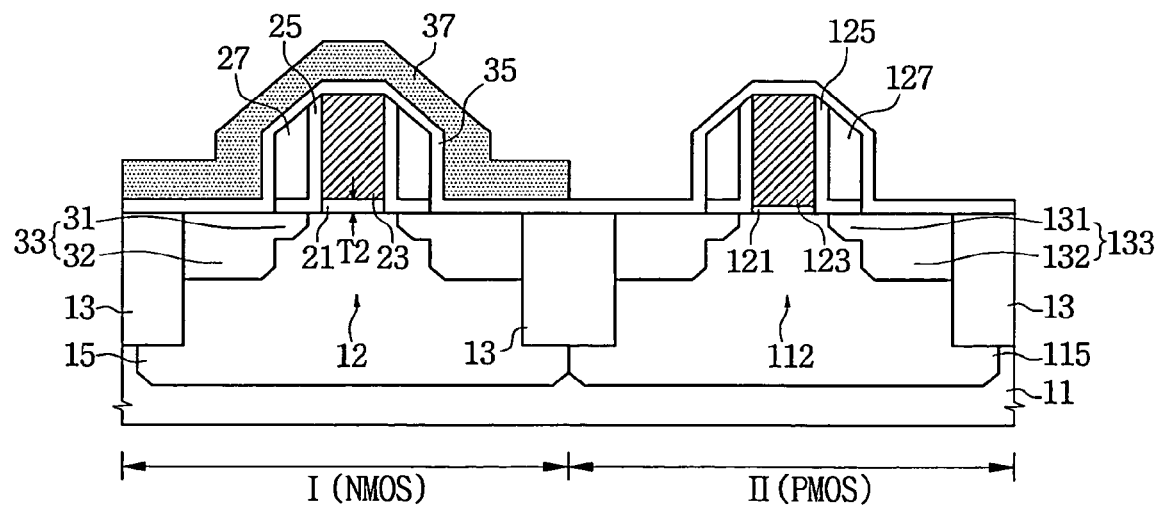

Referring to FIGS. 1 and 5, the capping nitride layer 37 may be patterned to expose the sacrificial oxide layer 35 on the second region II. Patterning the capping nitride layer 37 may include forming a photoresist pattern (not shown), partially removing the capping nitride layer 37 using the photoresist pattern as an etch mask, and removing the photoresist pattern. As a result, the capping nitride layer 37 may cover the first gate electrode 23, the first offset spacer 25, the first sidewall spacer 27, and the first source/drain regions 33. In other example embodiments, the capping nitride layer 37 and the sacrificial oxide layer 35 may be serially patterned, so that the second gate electrode 123, the second offset spacer 125, the second sidewall spacer 127, and the second source/drain regions 133 can be exposed.

Afterwards, a first annealing process (S500) may be performed on the semiconductor substrate 11 having the capping nitride layer 37, and a second annealing process (S600) may be subsequently performed. The first annealing process (S500) may be performed at a temperature of about 1000° C. to about 1100° C. using a Rapid Thermal Processing (RTP) device. In some example embodiments, the first annealing process (S500) may be omitted.

The second annealing process (S600) may be performed at a higher temperature than the first annealing process (S500). The second annealing process (S600) may be performed using a different annealing process from the first annealing process (S500). The second annealing process (S600) may be performed at a temperature of about 1100° C. to about 1300° C. using a millisecond annealing (MSA) technique. For example, the second annealing process (S600) may be performed at a temperature of 1250° C. The MSA technique may include, e.g., a laser spike annealing (LSA) technique, a flash lamp annealing (FLA) technique, etc.

As a result, the capping nitride layer 37 may exhibit a low etch rate and high stress values due to the first annealing process (S500) and/or the second annealing process (S600). Further, the thickness of the first gate dielectric layer 21 may be increased due to the first annealing process (S500) and/or the second annealing process (S600). That is, the first gate dielectric layer 21 may have a second thickness T2 greater than the first thickness T1, i.e., greater than the initial thickness. The second thickness T2 may be increased 0.5 Å to 2.0 Å more than the first thickness T1.

Figure 6:
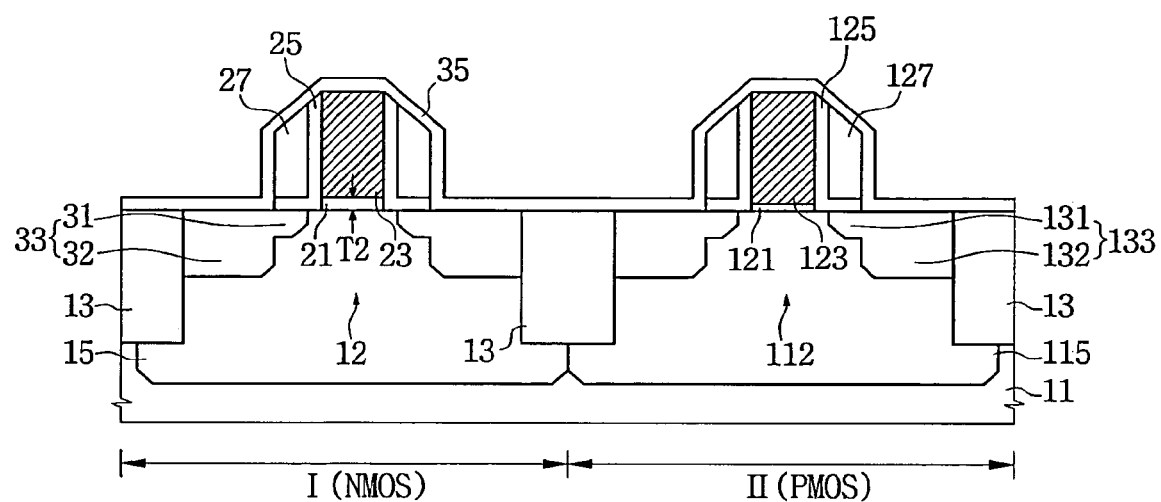

Referring to FIGS. 1 and 6, the capping nitride layer 37 may be removed to expose the sacrificial oxide layer 35 (S700). For example, the removal of the capping nitride layer 37 may employ a cleaning process using $H_3PO_4$, an isotropic etching process, etc. The capping nitride layer 37 may be completely removed, as shown in FIG. 6. A semiconductor device may then be completed using subsequent processes such as a silicide process, a process of forming an etch stop layer, and a process of forming interlayer dielectrics (ILD) after forming the sacrificial oxide layer 35. Such processes are well known, and further details thereof will be omitted for clarity and succinctness.

Second Example Embodiment

Figure 7:
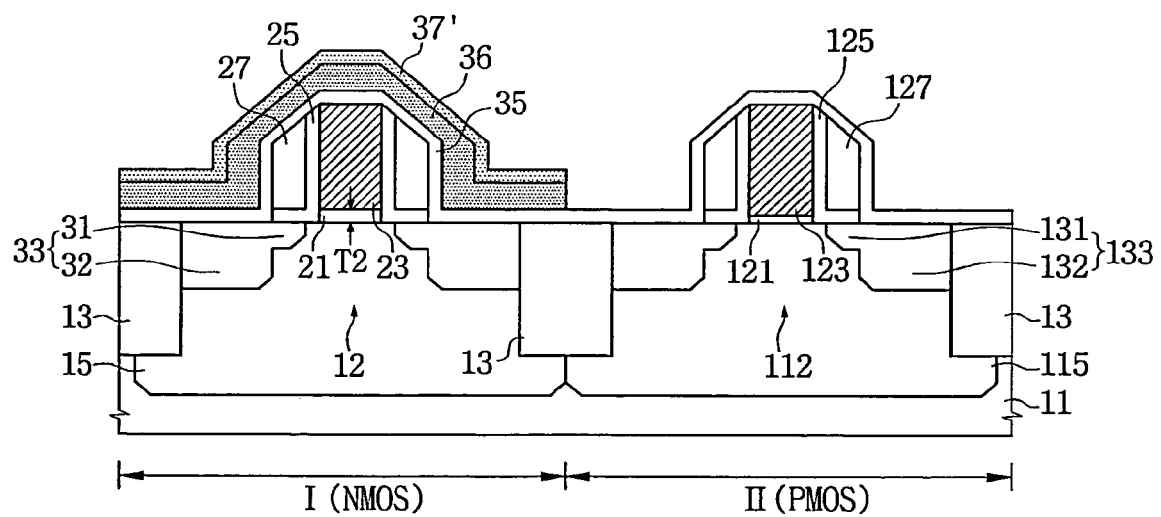
FIGS. 7 and 8 illustrate cross-sectional views of stages in a method of forming a semiconductor device according to a second example embodiment.
Figure 8:
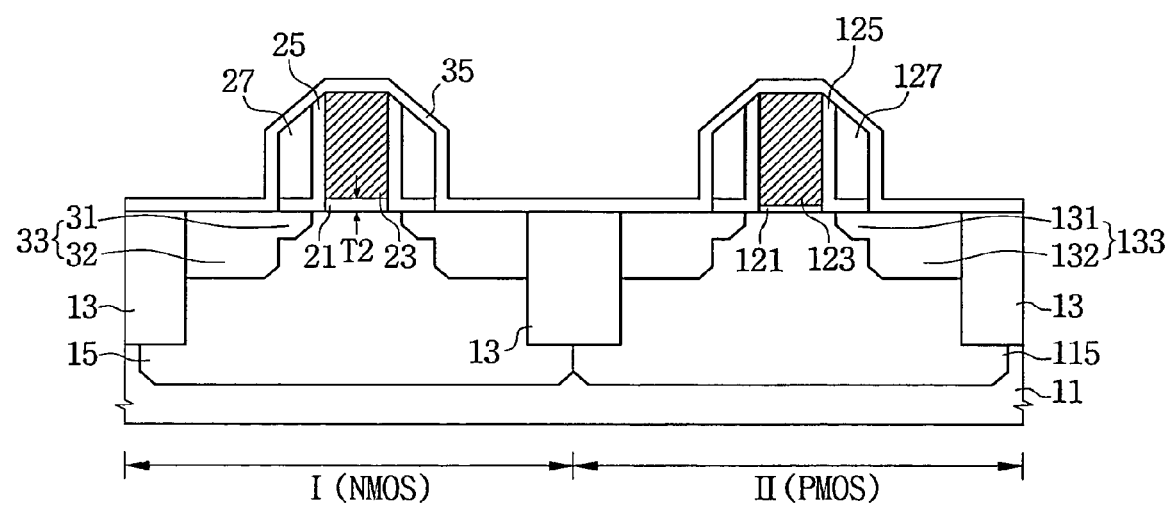

FIGS. 7 and 8 illustrate cross-sectional views of stages in a method of forming a semiconductor device according to a second example embodiment. Operations for forming the structure shown in FIG. 7 may be substantially the same as those described above in connection with FIGS. 1-6. Accordingly, a detailed description thereof will not be repeated.

Referring to FIGS. 7 and 8, a first capping nitride layer 36 and a second capping nitride layer 37' may be sequentially formed on a sacrificial oxide layer 35. The first capping nitride layer 36 and the second capping nitride layer 37' may cover a first gate electrode 23, a first offset spacer 25, a first sidewall spacer 27 and first source/drain regions 33.

The first capping nitride layer 36 may be formed of a high-H SiN layer, i.e., a SiN layer high in N—H bonding relative to Si—H bonding. For example, the first capping nitride layer 36 may be formed such that a ratio of Si—H % to N—H % is 1 or lower, when measuring the Si—H and N—H bonding using FTIR spectroscopy. The first capping nitride layer 36 may be referred to as an N—H rich SiN layer. The second capping nitride layer 37' may be formed to cover the first capping nitride layer 36. The first capping nitride layer 36 may be interposed between the second capping nitride layer 37' and the sacrificial oxide layer 35. The second capping nitride layer 37' may be formed of a Si—H rich SiN layer. The second capping nitride layer 37' may be formed using a method similar to that described with reference to FIGS. 4 to 6.

Then, a first annealing process (S500) may be performed on the semiconductor substrate 11 having the first capping nitride layer 36 and the second capping nitride layer 37', after which a second annealing process (S600) may be performed.

The second capping nitride layer 37' may exhibit a low etch rate and high stress values as a result of the first annealing process (S500) and/or the second annealing process (S600). Also, the thickness of the first gate dielectric layer 21 may be increased, relative to its initial thickness, as a result of the first annealing process (S500) and/or the second annealing process (S600).

Referring to FIG. 8, the first capping nitride layer 36 and the second capping nitride layer 37' may be removed. In an implementation, one or both of the first capping nitride layer 36 and the second capping nitride layer 37' may be completely removed.

Experimental Example 1

Figure 9:
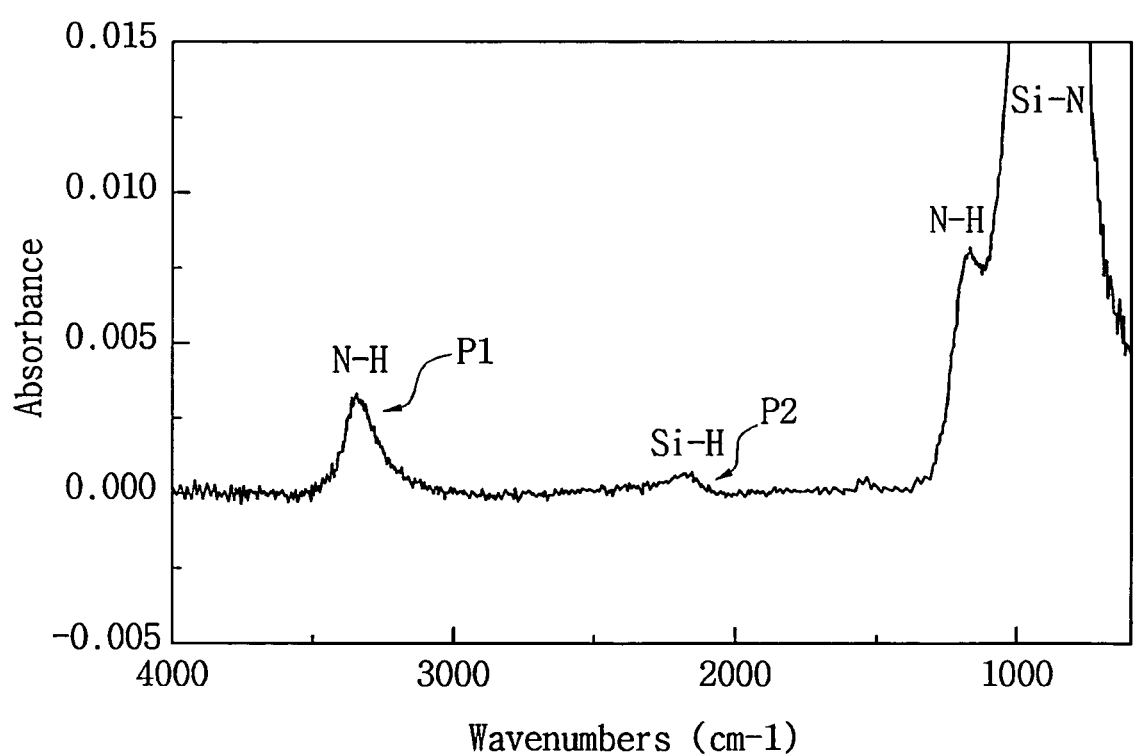
FIG. 9 illustrates a graph of results of measuring an N—H rich SiN layer using Fourier Transform Infrared (FTIR) spectroscopy.
Figure 10:
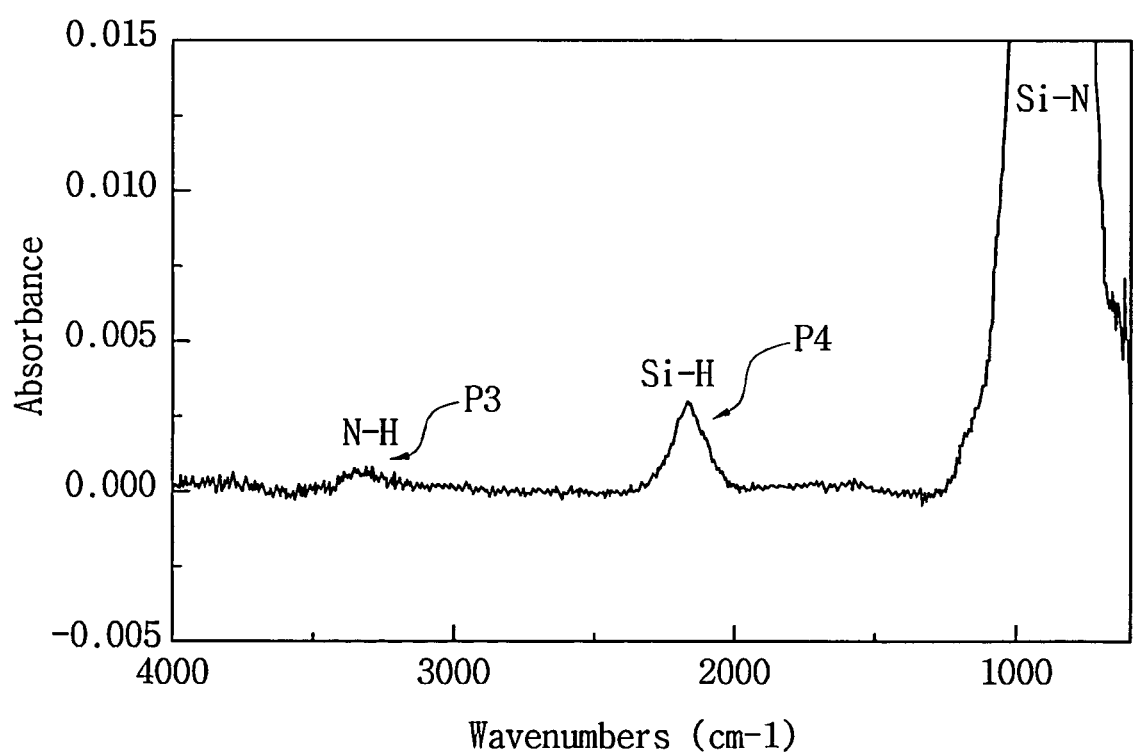
FIG. 10 illustrates a graph of results of measuring a Si—H rich SiN layer using FTIR spectroscopy.

FIG. 9 illustrates a graph of results of measuring an N—H rich SiN layer using Fourier Transform Infrared (FTIR) spectroscopy, and FIG. 10 illustrates a graph of results of measuring a Si—H rich SiN layer using FTIR spectroscopy. In Table 1, characteristics of an N—H rich SiN layer and a Si—H rich SiN layer according to Experimental Example 1 are compared.

TABLE 1

|  |  | N—H rich SiN | | | Si—H rich SiN | | |
| --- | --- | --- | --- | --- | --- | --- | --- |
|  |  | As dep | After RTP | After MSA | As dep | After RTP | After MSA |
| WER (Å/min) @ $H_3PO_4$ | | — | 209 | 206 | 193 | 58 | 54 |
| Stress (GPa) | | 1.11 | 1.14 | 1.14 | 0.05 | 1.17 | 1.21 |
| Contents (RBS) | Si (at %) | 34.4 | 37.6 | 36.9 | 44.6 | 48.3 | 48.8 |
|  | N (at %) | 51.2 | 53.1 | 54.0 | 45.9 | 50.9 | 50.3 |
|  | H (at %) | 14.4 | 9.3 | 9.1 | 9.5 | 0.9 | 0.9 |

Table 1 notes:
WER (wet etch rate);
RBS (Rutherford Backscattering Spectroscopy);
As Dep (as deposited, before RTP);
After RTP (after rapid thermal processing (first anneal));
After MSA (after millisecond anneal (second anneal));
at % (atomic percent).

Referring to Table 1, "As dep" (deposition) corresponds to the formation (S400) of the capping nitride layer of FIG. 1, "After Rapid Thermal Processing (RTP)" corresponds to the first annealing process (S500) of FIG. 1, and "After millisecond annealing (MSA)" corresponds to the second annealing (S600) of FIG. 1. In Experimental Example 1, the first annealing process (S500) was carried out at a temperature of 1070°

C. using an RTP device, and the second annealing process (S600) was carried out at a temperature of 1250° C. using a laser spike annealing (LSA) device as an MSA device. The second annealing process (S600) may use a different MSA device such as a flash lamp annealing (FLA) device. "WER (Å/min) @ $H_3PO_4$" denotes a wet etch rate (WER) when etching is performed using $H_3PO_4$, and a unit is Å/min. The Si—H rich SiN layer exhibited a significant reduction in a WER depending on results of the first annealing process (S500) and/or the second annealing process (S600). "Stress (GPa)" denotes tensile stress values of the N—H rich SiN layer and the Si—H rich SiN layer, and a unit is GPa. The Si—H rich SiN layer exhibited a significant increase in tensile stress values depending on results of the first annealing process (S500) and the second annealing process (S600). "Contents (RBS)" denotes results measured using Rutherford Backscattering Spectroscopy (RBS) to confirm a composition ratio of the N—H rich SiN layer and the Si—H rich SiN layer, and a unit is atomic %.

Referring to FIGS. 9 and 10, wave numbers are plotted on the horizontal axis of FIGS. 9 and 10, and a unit is $cm^{-1}$. Absorbance measured by FTIR spectroscopy is plotted on the vertical axis of FIGS. 9 and 10. Referring to FIG. 9, an N—H rich SiN layer according to Experimental Examples exhibited a higher level of an N—H peak P1 than a Si—H peak P2. Referring to FIG. 10, a Si—H rich SiN layer according to Experimental Examples exhibited a higher level of a Si—H peak P4 than an N—H peak P3. In this case, a ratio of Si—H % to N—H % may be 5 or higher.

Experimental Example 2

A test for confirming thickness variation of a gate dielectric layer according to example embodiments was conducted. Semiconductor devices similar to that illustrated in FIG. 5 were formed, and the capping nitride layer 37 was classified into a first group: an N—H rich SiN layer, and a second group: a Si—H rich SiN layer. First gate dielectric layers of the first and second groups were formed to the same thickness of 23 Å. The first gate dielectric layers may be a part of elements of NMOS transistors. In Experimental Example 2, a first annealing process (S500) was performed at a temperature of 1070° C. using an RTP device, and a second annealing process (S600) was performed at a temperature of 1250° C. using an LSA device as an MSA device. The second annealing process (S600) may employ a different MSA device such as an FLA device. In the first group, even after the first annealing process (S500) and the second annealing process (S600), there was no increase in thickness of the first gate dielectric layers. On the other hand, while there was insignificant thickness variation of the first gate dielectric layers after the first annealing process (S500) in the second group, the thickness of the first gate dielectric layers after the second annealing process (S600) was 23.5 Å to 25 Å. Thus, the thickness of the first gate dielectric layers after the second annealing process (S600) was increased by 0.5 Å to 2 Å in the second group employing the Si—H rich SiN layer according to example embodiments.

Experimental Example 3

Figure 11:
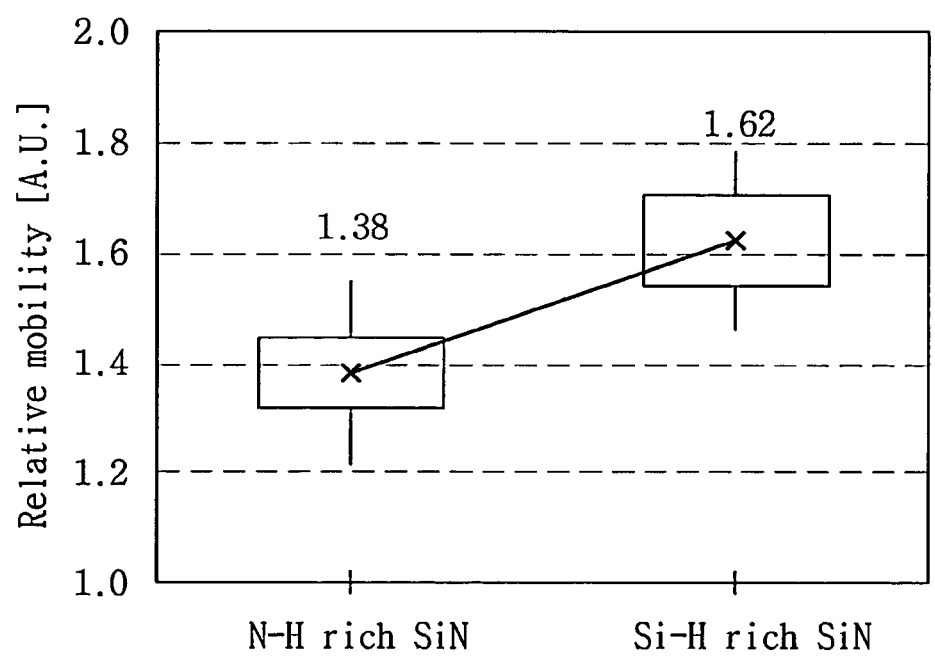
FIG. 11 illustrates a graph of mobility characteristics according to example embodiments.
Figure 12:
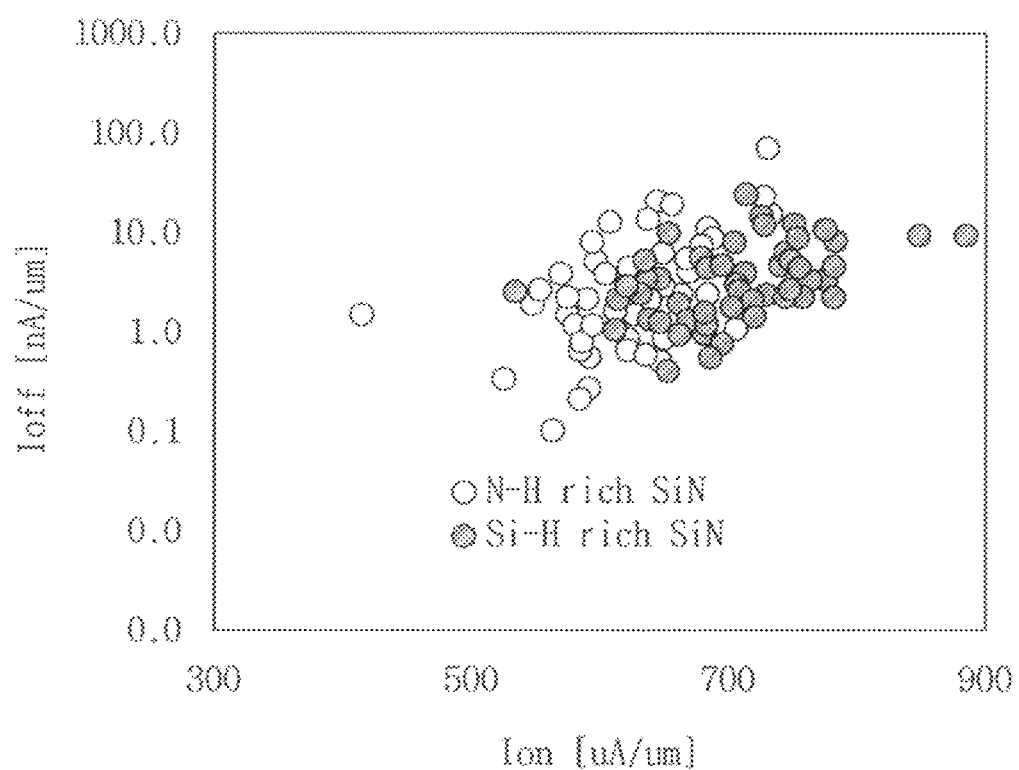
FIG. 12 illustrates a graph of current characteristics according to example embodiments.

FIG. 11 illustrates a graph of mobility characteristics according to example embodiments, and FIG. 12 illustrates a graph of current characteristics according to example embodiments. Semiconductor devices similar to that of FIG. 5 were formed in Experimental Example 3, and the capping nitride layer 37 was classified into a first group: an N—H rich SiN layer and a second group: a Si—H rich SiN layer. The first group and the second group were applied to NMOS transistors formed in the first region (I of FIG. 5). Moreover, the first annealing process (S500) was performed at a temperature of 1070° C. using an RTP device, and the second annealing process (S600) was performed at a temperature of 1250° C. using an LSA device as an MSA device. The second annealing process (S600) may use a different MSA device such as an FLA device.

Relative mobility is plotted on a vertical axis of FIG. 11, and a unit is an arbitrary unit (A.U.). Referring to FIG. 11, it is observed that the relative mobility was significantly increased in the second group employing the Si—H rich SiN layer.

The current "Ion" (on current) of an NMOS transistor is plotted on the horizontal axis of FIG. 12, and a unit is μA/um. The current "Ioff" (off current) of an NMOS transistor is plotted on the vertical axis of FIG. 12, and a unit is nA/um. Referring to FIG. 12, the on current Ion was increased in the second group employing the Si—H rich SiN layer.

As described above, according to example embodiments, a capping nitride layer may be formed to cover an NMOS transistor structure, the capping nitride layer including a Si—H rich SiN layer. After an annealing process is performed on the semiconductor substrate having the capping nitride layer, the capping nitride layer may be removed, e.g., completely removed. While the annealing process is performed on the semiconductor substrate, the presence of the capping nitride layer having strong tensile stress causes stress to be applied to a channel region of the NMOS transistor. As a result, an NMOS transistor exhibiting excellent performance may be formed.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    forming an NMOS transistor having a gate electrode on a gate dielectric layer and source/drain regions in a semiconductor substrate;
    forming a first tensile stress capping nitride layer covering the gate electrode and the source/drain regions of the NMOS transistor, the first tensile stress capping nitride layer including a Si—H rich SiN layer;
    annealing the semiconductor substrate having the first tensile stress capping nitride layer, such that a thickness of the gate dielectric layer is increased due to the annealing; and
    removing the first tensile stress capping nitride layer, the method further comprising:
    forming a second capping nitride layer having an N—H rich SiN layer on the NMOS transistor before forming the first tensile stress capping nitride layer, the second capping nitride layer being directly on the NMOS transistor, and the first tensile stress capping nitride layer being directly on the second capping nitride layer over the NMOS transistor.

2. The method as claimed in claim 1, wherein a ratio of Si—H % and N—H % in the first tensile stress capping nitride layer is about 2 to about 10.

3. The method as claimed in claim 1, wherein a ratio of Si—H % and N—H % in the first tensile stress capping nitride layer is about 5 or higher.

4. The method as claimed in claim 1, wherein the first tensile stress capping nitride layer has a tensile stress of about 0.01 GPa to about 2.5 GPa.

5. The method as claimed in claim 1, further comprising forming a sacrificial oxide layer covering the gate electrode and the source/drain regions before forming the first tensile stress capping nitride layer.

6. The method as claimed in claim 1, wherein a ratio of Si—H % and N—H % in the second capping nitride layer is about 1 or lower.

7. The method as claimed in claim 1, wherein annealing the semiconductor substrate includes processing the semiconductor substrate having the first tensile stress capping nitride layer at a temperature of about 1100° C. to about 1300° C.

8. The method as claimed in claim 7, wherein the annealing is performed using at least one of a laser spike annealing technique and a flash lamp annealing technique.

9. The method as claimed in claim 1, wherein annealing the semiconductor substrate comprises:
performing a first annealing process on the semiconductor substrate having the first tensile stress capping nitride layer at a temperature of about 1000° C. to about 1100° C.; and
after performing the first annealing process, performing a second annealing process at a temperature higher than the first annealing process.

10. The method as claimed in claim 9, wherein:
the first annealing process is performed using a rapid thermal processing device, and
the second annealing process is performed at a temperature of about 1100° C. to about 1300° C. using at least one of a laser spike annealing technique and a flash lamp annealing technique.

11. The method as claimed in claim 1, wherein a thickness of the gate dielectric layer is increased by about 0.5 Å to about 2 Å.

12. A method of forming a semiconductor device, comprising:
forming an NMOS transistor including a gate dielectric layer and a PMOS transistor in a semiconductor substrate;
forming a first tensile stress capping nitride layer covering the NMOS transistor, the first tensile stress capping nitride layer including a Si—H rich SiN layer;
annealing the semiconductor substrate having the first tensile stress capping nitride layer, such that a thickness of the gate dielectric layer is increased due to the annealing; and
removing the first tensile stress capping nitride layer, the method further comprising:
forming a second capping nitride layer having an N—H rich SiN layer on the semiconductor substrate before forming the first tensile stress capping nitride layer, the second capping nitride layer being directly on the NMOS transistor, and the first tensile stress capping nitride layer being directly on the second capping nitride layer over the NMOS transistor, wherein a ratio of Si—H % and N—H % in the second capping nitride layer is about 1 or lower.

13. The method as claimed in claim 12, wherein forming the NMOS transistor comprises:
forming an isolation layer defining a p-active region in the semiconductor substrate;
forming a gate dielectric layer and a gate electrode on the p-active region; and
forming source/drain regions in the p-active region adjacent to both sides of the gate electrode.

14. The method as claimed in claim 13, wherein a thickness of the gate dielectric layer is increased by about 0.5 Å to about 2.0 Å.

15. The method as claimed in claim 12, wherein a ratio of Si—H % and N—H % in the first tensile stress capping nitride layer is about 5 to about 10.

16. The method as claimed in claim 12, wherein the first tensile stress capping nitride layer has a tensile stress of about 0.01 GPa to about 2.5 GPa.

17. The method as claimed in claim 12, further comprising forming a sacrificial oxide layer covering the NMOS transistor before forming the first tensile stress capping nitride layer.

18. The method as claimed in claim 12, wherein annealing the semiconductor substrate comprises:
performing a first annealing process on the semiconductor substrate having the first tensile stress capping nitride layer at a temperature of 1000° C. to 1100° C. using a rapid thermal processing device; and
after performing the first annealing process, performing a second annealing process on the semiconductor substrate at a temperature of 1100° C. to 1300° C. using at least one of a laser spike annealing technique and a flash lamp annealing technique.

* * * * *